United States Patent
Scott et al.

(10) Patent No.: US 7,081,369 B2
(45) Date of Patent: Jul. 25, 2006

(54) FORMING A SEMICONDUCTOR DEVICE FEATURE USING ACQUIRED PARAMETERS

(75) Inventors: Dane L. Scott, Rancho Cordova, CA (US); Kevin J. Vasquez, Citrus Heights, CA (US)

(73) Assignee: Intel Corporation, Santa Clara, CA (US)

( * ) Notice: Subject to any disclaimer, the term of this patent is extended or adjusted under 35 U.S.C. 154(b) by 486 days.

(21) Appl. No.: 10/377,062

(22) Filed: Feb. 28, 2003

(65) Prior Publication Data

US 2004/0171178 A1 Sep. 2, 2004

(51) Int. Cl.
*H01L 21/66* (2006.01)

(52) U.S. Cl. ............................................. 438/18
(58) Field of Classification Search ............... 438/18; 204/298.11; 702/155
See application file for complete search history.

(56) References Cited

U.S. PATENT DOCUMENTS

| 5,843,846 | A | | 12/1998 | Nguyen et al. ............. 438/713 |
| 5,936,304 | A | | 8/1999 | Lii et al. .................... 257/701 |
| 6,245,587 | B1 | * | 6/2001 | Vallett ......................... 438/18 |
| 6,432,798 | B1 | | 8/2002 | Liu et al. .................... 438/433 |
| 6,509,276 | B1 | | 1/2003 | Scott .......................... 438/712 |
| 6,592,728 | B1 | * | 7/2003 | Paranjpe et al. ........ 204/298.11 |
| 6,633,831 | B1 | * | 10/2003 | Nikoonahad et al. ........ 702/155 |

OTHER PUBLICATIONS

Disclosure Of Information Pursuant To M.P.E.P. §§ Apr. 2001 and Jun. 2001.

* cited by examiner

*Primary Examiner*—Michael Lebentritt
*Assistant Examiner*—Andre' C. Stevenson
(74) *Attorney, Agent, or Firm*—Trop, Pruner & Hu, P.C.

(57) ABSTRACT

In one embodiment of the present invention, a method includes acquiring parameters for a desired feature of a semiconductor device; determining a data array using the parameters; and forming the desired feature using the data array. The desired feature in one embodiment may be a backside trench.

25 Claims, 3 Drawing Sheets

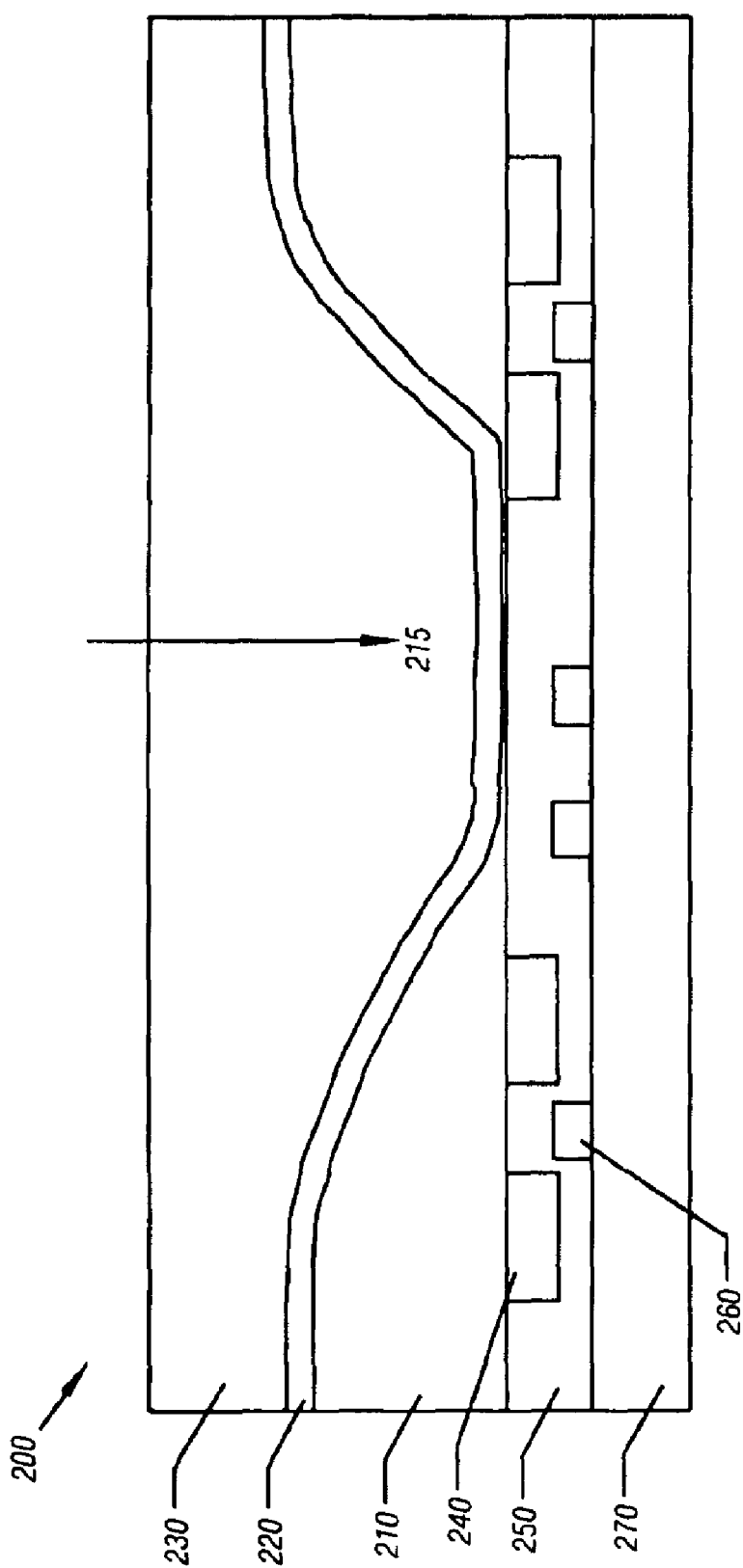

FORMING A SEMICONDUCTOR DEVICE FEATURE USING ACQUIRED PARAMETERS

BACKGROUND

The invention relates to forming features of a semiconductor device, and more particularly to formation of trenches.

In the process of forming semiconductor devices, the devices are generally tested in a number of ways. Typically, an integrated circuit design is configured into a blueprint which is copied by complex machinery into a physical structure. After fabrication, the physical structure enters a debug cycle. During debug, the integrated circuit product is tested to identify and correct any logical or speed test issues. Debug laboratory tools are designed to reduce the debug cycle times.

One such debug tool is a focused ion beam (FIB) tool which may be used for circuit editing, circuit debug, fault isolation, and failure analysis. One task performed by a FIB tool is formation of device features, such as a trench. Such a trench may be formed on a backside of a wafer so that underlying layers of the integrated circuit may be edited. Typically, such a trench is fabricated by forming a small series of box patterns (typically five or less), each manually defined by a user at the same location with progressively smaller sizes, each having an etch depth of ⅕ (or more) of the intended total depth. However such a trench has an undesirable stair step pattern and a sharp edge pattern. This pattern leads to increased resistance, capacitance, lower frequency transmission and voids of a metal line formed in the trench, among other problems. Thus a need exists to form features to reduce or avoid such problems.

BRIEF DESCRIPTION OF THE DRAWINGS

FIG. 3 is a cross section of a semiconductor device in accordance with one embodiment of the present invention.

DETAILED DESCRIPTION

Figure 1:
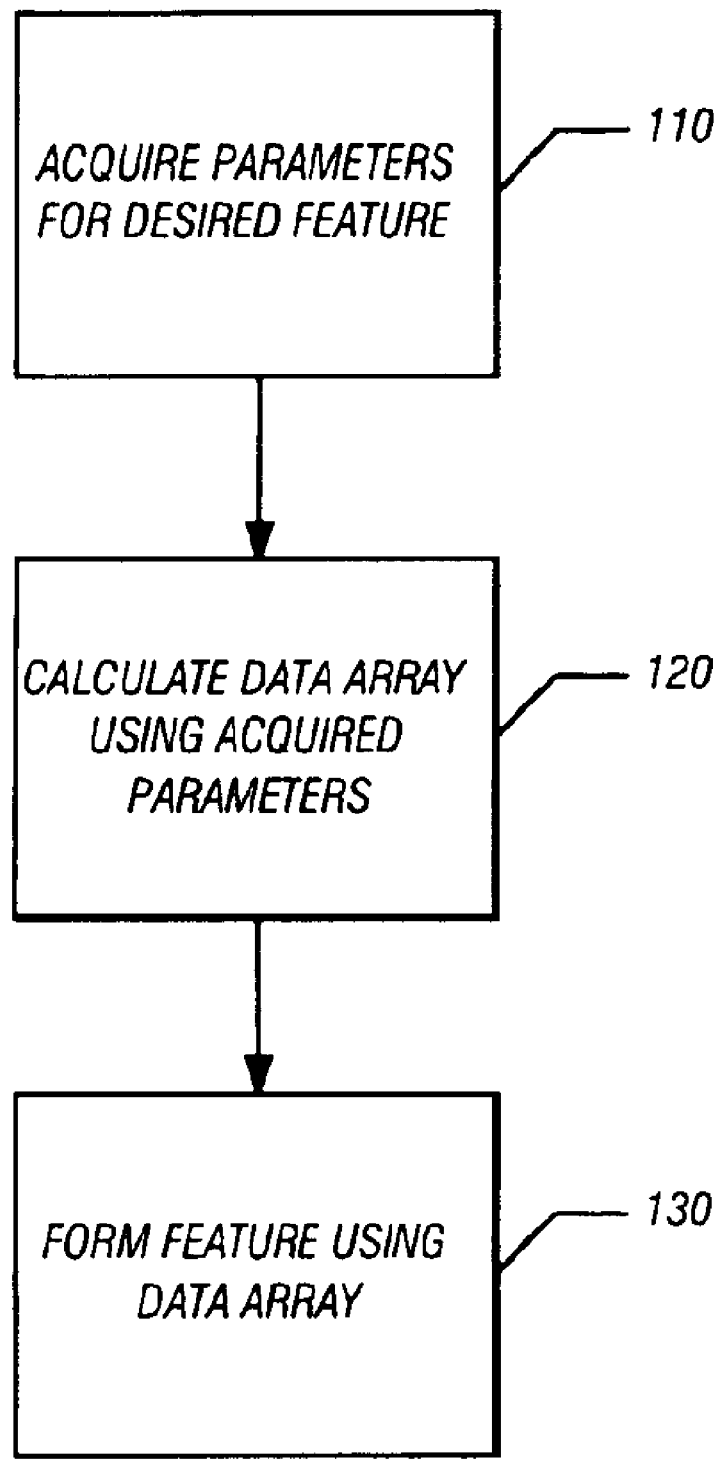
FIG. 1 is a flow diagram of a method in accordance with one embodiment of the present invention.

FIG. 1 is a flow diagram of a method in accordance with one embodiment of the present invention. As shown in FIG. 1, parameters may be acquired for a desired feature (block 110). For example, in one embodiment a trench may be selected as a desired feature and accordingly, parameters corresponding to the trench may be acquired. In certain embodiments the parameters may include sizing information relating to the trench, such as desired trench dimensions, a primary pattern size for forming the trench, and the like. In one embodiment, shaping information, such as angles or slope relating to the trench may also be obtained, as well as dosage information for the FIB tool. While parameters may be acquired via user input, in other embodiments parameters may be provided automatically.

In an embodiment in which a user provides parameters, user input may be obtained in various ways. For example, a user may input parameters via a personal computer (PC) or other data processing system, a user input device associated with semiconductor processing equipment such as a FIB tool, a layout tool, or in another manner.

As shown in the flow diagram of FIG. 1, next a data array may be determined using the acquired parameters (block 120). The data array may include an array of dimensions for forming a feature, as well as process controls or instructions for the same. For example, in one embodiment the data array may include a plurality of dimensions (e.g., width, height, and depth) for each of a plurality of patterns to be used in forming the trench. Such a data array may be calculated by using one or more algorithms in accordance with an embodiment of the present invention, as discussed further below. Finally, the desired feature may be formed using the data array (block 130). For example, in one embodiment a FIB tool or other physical etching tool, such as a laser chemical etching tool, may be used to form the trench using information in the data array.

In one embodiment, an algorithm in accordance with an embodiment of the present invention may be used to develop a data array which includes sizing information for each pattern (e.g., box or circle) to be formed by a FIB tool. In one embodiment, a user may provide basic parameters, such as a primary pattern size (e.g., a height and width of a box). Thus in such an embodiment, the pattern for each tool iteration may be calculated automatically based on limited user input (e.g., a primary pattern size), namely a single user input. For example, in such an embodiment the algorithm may calculate an appropriate pattern size (e.g., width and height) for each of the patterns to be formed. In certain embodiments, patterns may be calculated to have a relational connection to preceding and succeeding patterns. The data for each pattern (i.e., tool iteration) may be collected in the data array. In other embodiments, a user may provide additional parameters, such as desired depth and dosage. In still other embodiments a user may provide further parameters for calculating a data array.

Upon completion, the data array may be output into a standard, tool-readable format. Such tool-readable format may be stored in a file which, in various embodiments, may be stored on a computer readable medium.

In one embodiment, an algorithm may be used that calculates the sizes of each pattern (e.g., box or circle) by incrementally adding a calculated increment value to a baseline value and its calculated successor(s). The calculated step size for a given iteration may then be stored in a data array for later use in feature formation. In one embodiment, calculated step sizes may be determined until a maximum value is reached.

In one embodiment, an algorithm may be used to determine a calculated increment value ("TrenchLayerDefine") for a "X" dimension of a tool iteration as follows:

$$\text{TrenchLayerDefine} = (\text{TotalDepth}/\text{AngleCal}) * \cos((\text{AngleID}) * X\text{Incrementor}/(\text{TotalDepth}/\text{AngleCal}) + \pi) + (\text{TotalDepth}/\text{AngleCal}) \quad [1]$$

where the Total Depth is a total depth of the trench desired by the user; AngleCal is an "angle calibration" used to calibrate the user's angle expectations with an actual end result; AngleID is an angle of the general slope of the trench desired by the user; and XIncrementor is a value of an "X" dimension of the previous pattern (i.e., tool iteration), based upon a progression of intended depth transitions. Thus this algorithm provides a relation between tool iterations. Of course, a similar algorithm may be used to determine a calculated increment value for an "Y" dimension of a tool iteration. As discussed, in one embodiment the calculated increment value may be added to a baseline value selected by a user or a previous calculated step size. Other algorithms may be used to determine dimensions for tool iterations in different embodiments.

In other embodiments, two different angle values may be selected by a user (i.e., HAngleID and WAngleID) to reference vertical and horizontal slope designs independently of each other to broaden user flexibility.

Figure 2:
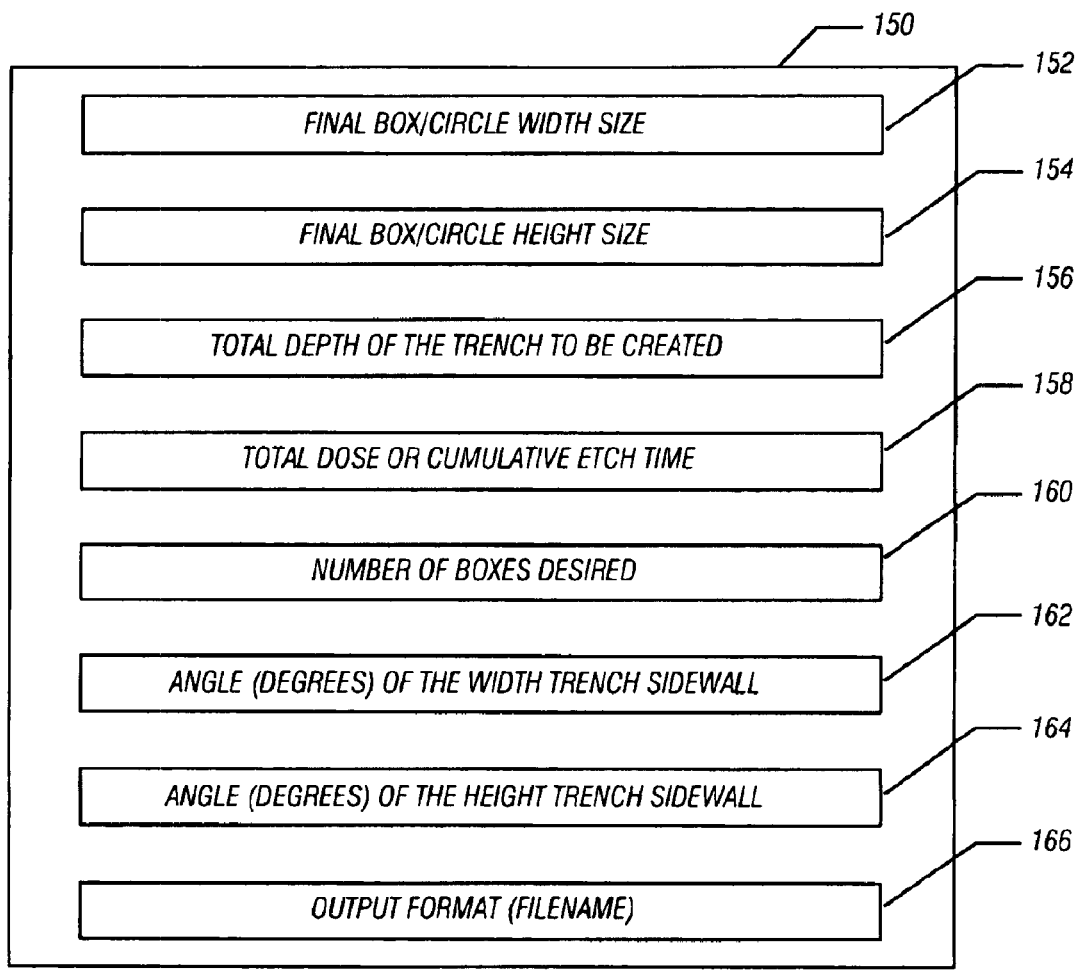
FIG. 2 is a display screen in accordance with one embodiment of the present invention.

Referring now to FIG. 2, shown is a display screen in accordance with one embodiment of the present invention. In various embodiments, such a display screen may be presented to a user on a PC or a display associated with a FIB tool or other physical etching tool. As shown in FIG. 2, user input screen 150 may include a number of parameters for which a user may enter desired values. In the embodiment of FIG. 2, user input screen 150 lists parameters which may be obtained for calculating a data array for a trench. As shown in FIG. 2, these parameters may include final box/circle width size 152; final box/circle height size 154; total depth 156 of the trench to be created; total dose or cumulative etch time 158; number of boxes desired 160; angle 162 of the width trench sidewall; angle 164 of the height trench sidewall; and output format (filename) 166.

While the values selected for these parameters may vary in different embodiments, in certain embodiments the values for final box/circle width size 152 may be between approximately 1.0 micron (μm) and 2500.0 μm and the final box/circle height size 154 may be between approximately 1.0 μm and 2500.0 μm. While described as a box or circle, in other embodiments a feature may be formed using any other shape possible using a physical etching tool, such as a polygon. In certain embodiments, total depth 156 of the trench to be created 156 may be between approximately 1.0 μm and 750.0 μm. In certain embodiments, total dose or cumulative etch time 158 may be given as a rate of beam energy applied in nano-coulombs per square micron (nC/μm$^2$), and may be between approximately 1.0 nC/μm$^2$ and 10.0 nC/μm$^2$. While the number of boxes desired 160 may vary widely in different embodiments, between approximately 10 and 100 boxes may be formed in certain embodiments.

In various embodiments, a conventional FIB tool may be used to form a trench. Such a conventional FIB tool may be located in a chamber, typically constructed of aluminum or steel and having a suitable inside volume to house a semiconductor wafer. In certain embodiments, the chamber may also be provided with a heat source, vacuum and gas sources, and the like. In forming trenches and other features in accordance with the present invention, conventional temperatures, pressures, and tool energies may be used. Of course, in other embodiments, other parameters may be similarly suitable.

In one embodiment, the FIB tool may be a Micrion 9800FC column produced by FEI Corporation (Hillsboro, Oreg.). In one example embodiment of a process using this FIB tool, a trench approximately 8.0 μm by 14.0 μm may be formed. In forming the trench in this embodiment, 48 tool iterations may be used in which the width and height of each tool iteration may be incrementally decremented by 0.175 μm. Further, each tool iteration may have a dosage of approximately 0.125 nC/μm$^2$, providing a total dosage of approximately 6.0 nC/μm$^2$.

In various embodiments, individual components associated with the chamber may be coupled to a controller. Such a controller may control, for example, chamber pressure and temperature, as well as the introduction of the FIB tool and any desired source gas. In one embodiment, the controller may include a processor and a memory, which in turn may include instructions accessible by the processor to control the patterning occurring within the chamber. Of course, the memory may also include desired set points, such as temperature, pressure, source gas flow rate, and the like, as well as instructions to obtain the input of parameters and determine a data array in accordance with an embodiment of the present invention. Alternately, such instructions may be stored on another storage media. For example, the instructions may be stored on a medium associated with a computer system, the controller, or another device. The storage medium may include, but is not limited to, any type of disk including floppy disks, optical disks, compact disk read-only memories (CD-ROMs), compact disk rewritables (CD-RWs), and magneto-optical disks, semiconductor devices such as flash memories, read-only memories (ROMs), random access memories (RAMs), erasable programmable read-only memories (EPROMs), electrically erasable programmable read-only memories (EEPROMs), magnetic or optical cards, or any type of media suitable for storing electronic instructions.

In one embodiment, the controller may be coupled to a user interface to allow a user to enter desired parameters for a particular process in accordance with the present invention. For example, a user interface may include a display and a keypad or other user input device (such as a touch screen display) to allow a user to input desired parameters in accordance with embodiments of the present invention.

While discussed above with regard to a FIB tool process, in other embodiments a laser or other physical etching process may be used.

While the number of shape patterns desired to complete a single feature may vary, in certain embodiments a high number (greater than ten) of box or circular patterns may be used. In such manner, a stepless and/or edgeless feature, such as a silicon trench may be formed in these embodiments. In other embodiments an optimal step resolution for a trench may be formed. As used herein the term "stepless" means a feature without a stair step appearance in a cross-sectional view. As used herein, the term "edgeless" describes the lack of any sharp corners, particularly at the top of the feature. In certain embodiments, a data array in accordance with the present invention may be calculated to be used in formation of a trench having a non-linear profile. Such a non-linear profile may provide for rounding off of corners of features.

Referring now to FIG. 3, shown is a cross section of a portion of a semiconductor device 200 in accordance with one embodiment of the present invention. As shown in FIG. 3, semiconductor device 200 may be formed on a substrate 210 which, in one embodiment may be a silicon substrate. The cross section of FIG. 3 is shown with the backside of the silicon substrate 210 facing upwards above layers forming the device. In certain embodiments, the device may be provided with controlled collapsible chip contact (C4) solder connections (not shown in FIG. 3), which connect the device to contact pads in a package substrate (also not shown in FIG. 3). As shown in FIG. 3, metal lines 240 may be formed on substrate 210. Further, a dielectric layer 250 may also be formed on the substrate 210. Additional layers of the semiconductor device, such as metal lines 260 and a final oxide layer 270 may also be formed on the substrate 210. It is to be understood that FIG. 3 shows generic layers of a semiconductor device and not any specific structure.

In accordance with embodiments of the present invention, a stepless and edgeless trench (generally at 215) may be formed on the backside of substrate 210. Such a trench may be formed for purposes of failure analysis, low yield analysis, fault isolation, or circuit editing, for example. A metal layer 220 may be deposited over trench 215 on the backside of substrate 210. In certain embodiments, metal layer 220 may be deposited using the FIB tool. Further, a dielectric layer 230 may be formed over metal layer 220 to insulate metal layer 220 as shown in FIG. 3. In other embodiments, trenches or other features may be formed during the fabrication of the semiconductor device.

In certain embodiments, FIB-deposited metal resistance may be reduced, enabling higher frequency edits due to processing corners being eliminated and reduced line capacitance due to an increased opportunity to add depth to post-etch dielectric layers (e.g., dielectric layer 230).

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   acquiring parameters for a desired feature of a semiconductor device;
   determining a data array using the parameters; and
   forming the desired feature using the data array by performing a plurality of tool iterations greater than ten.

2. The method of claim 1, further comprising using a focused ion beam removal tool to form the desired feature.

3. The method of claim 2, wherein determining the data array comprises calculating dimensions for each of the tool iterations based on a primary pattern size in the focused ion beam removal tool.

4. The method of claim 3, wherein the plurality of tool iterations form a trench having a non-linear profile on a backside of a substrate.

5. The method of claim 4, further comprising forming a metal layer over the non-linear profile.

6. The method of claim 1, further comprising forming a stepless silicon trench as the desired feature.

7. The method of claim 3, further comprising acquiring the primary pattern size via a user input device associated with the focused ion beam removal tool.

8. A method comprising:
   calculating a plurality of patterns corresponding to a desired feature of a semiconductor device from a set of parameters, the plurality of patterns greater than ten; and
   forming the desired feature using the plurality of patterns.

9. The method of claim 8, further comprising forming a trench on a backside of a substrate supporting the semiconductor device as the desired feature.

10. The method of claim 8, wherein the set of parameters comprise dimensions of a trench and at least one angle relating to the trench.

11. The method of claim 8, wherein calculating the plurality of patterns comprises calculating a plurality of box patterns and wherein the set of parameters comprises a primary box size.

12. The method of claim 8, further comprising forming the desired feature using a focused ion beam removal tool.

13. The method of claim 13, further comprising acquiring the set of parameters using an input device associated with the focused ion beam removal tool, and calculating the plurality of patterns in the focused ion beam removal tool.

14. A method comprising:
   removing portions of one or more layers of a semiconductor device to form a trench, wherein removing the portions comprises performing a plurality of operations each having a pattern determined from a set of parameters, wherein the plurality of operations is greater than ten.

15. The method of claim 14, further comprising calculating a plurality of box patterns, wherein the set of parameters comprises a primary box size.

16. The method of claim 14, further comprising forming the trench on a backside of the semiconductor device.

17. The method of claim 14, wherein the trench comprises a stepless silicon trench.

18. The method of claim 17, further comprising forming a metal layer over the stepless silicon trench.

19. The method of claim 14, wherein the one or more layers comprises a substrate of the semiconductor device.

20. The method of claim 1, wherein the data array corresponds to patterns for the desired feature.

21. The method of claim 1, further comprising determining the data array by incrementally adding a calculated increment value to a baseline value and one or more calculated successors thereto.

22. The method of claim 21, wherein the calculated increment value equals (Total Depth/Angle Cal)*Cos((Angle ID)*Incrementor/(Total Depth/Angle Cal)+π)+(Total Depth/Angle Cal), where the Total Depth is a total depth of the desired feature; Angle Cal is an angle of calibration, Angle ID is an angle of a general slope of the desired feature; and Incrementor is a value of a dimension of a previous one of the plurality of tool iterations.

23. The method of claim 1, wherein the parameters include a first slope and a second slope associated with the desired feature.

24. The method of claim 23, wherein the first slope and the second slope are horizontal and vertical slopes of a trench formed on a backside of a substrate.

25. The method of claim 22, wherein the desired feature comprises an edgeless trench on a backside of a substrate supporting the semiconductor devices.

* * * * *